United States Patent [19]
Hiruma

[11] Patent Number: 5,446,354
[45] Date of Patent: Aug. 29, 1995

[54] DRIVE APPARATUS FOR BRUSHLESS DC MOTOR AND FAILURE DIAGNOSING METHOD FOR THE SAME

[75] Inventor: Atsuyuki Hiruma, Fuji, Japan

[73] Assignee: Kabushiki Kaisha Toshiba, Kawasaki, Japan

[21] Appl. No.: 214,241

[22] Filed: Mar. 17, 1994

[30] Foreign Application Priority Data

Sep. 14, 1993 [JP] Japan ................. 5-228526

[51] Int. Cl.⁶ ............................... H01R 39/46
[52] U.S. Cl. .................... 318/439; 318/807; 318/798; 318/782
[58] Field of Search ............... 318/254, 138, 439, 807, 318/798, 782

[56] References Cited

U.S. PATENT DOCUMENTS

| | | | |
|---|---|---|---|
| 4,099,109 | 7/1978 | Abbondanti | 318/254 |
| 4,856,286 | 8/1989 | Sulfstede et al. | |
| 4,939,437 | 7/1990 | Farag et al. | 318/807 |
| 5,047,704 | 9/1991 | Yamauchi | 318/807 |
| 5,117,165 | 5/1992 | Cassat et al. | |
| 5,187,417 | 2/1993 | Minnich et al. | 318/254 |
| 5,296,785 | 3/1994 | Miller | 318/254 |

FOREIGN PATENT DOCUMENTS 64-8890 1/1989 Japan.

Primary Examiner—William M. Shoop, Jr.
Assistant Examiner—Karen Masih
Attorney, Agent, or Firm—Cushman Darby & Cushman

[57] ABSTRACT

When power is sequentially supplied to the phase coils of a brushless DC motor, the rotor of the brushless DC motor is rotated. At this time, a voltage is induced in one of the phase coils to which power is not supplied. The rotational position of the rotor is detected from the induced voltage. The switching timing of power supply to the phase coils is determined in accordance with the detected rotational position. When a service operation mode switch is operated, a service operation is executed, and power supply to the respective phase coils is forcibly switched at a predetermined frequency. A failure can be diagnosed during this service operation.

9 Claims, 5 Drawing Sheets

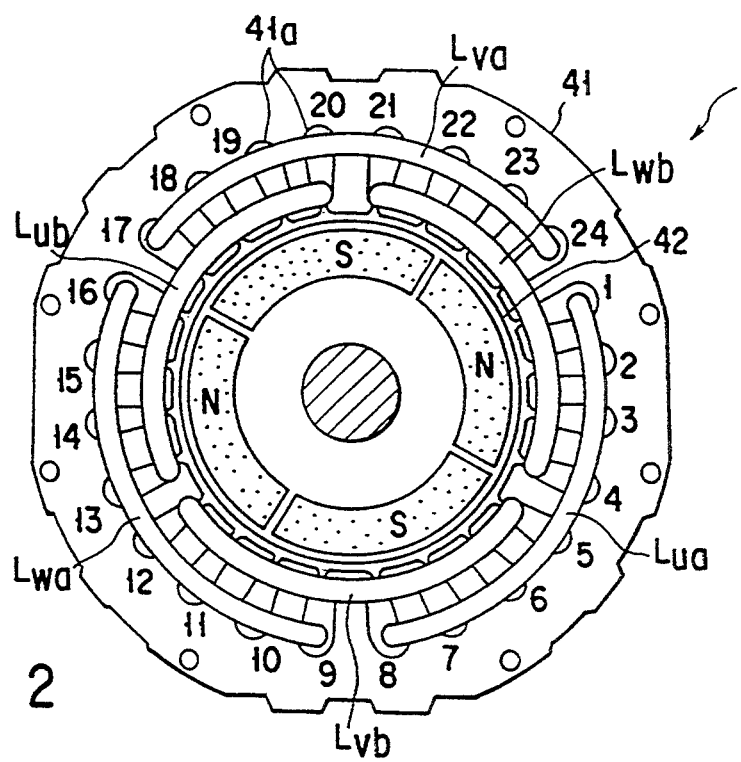
FIG. 2
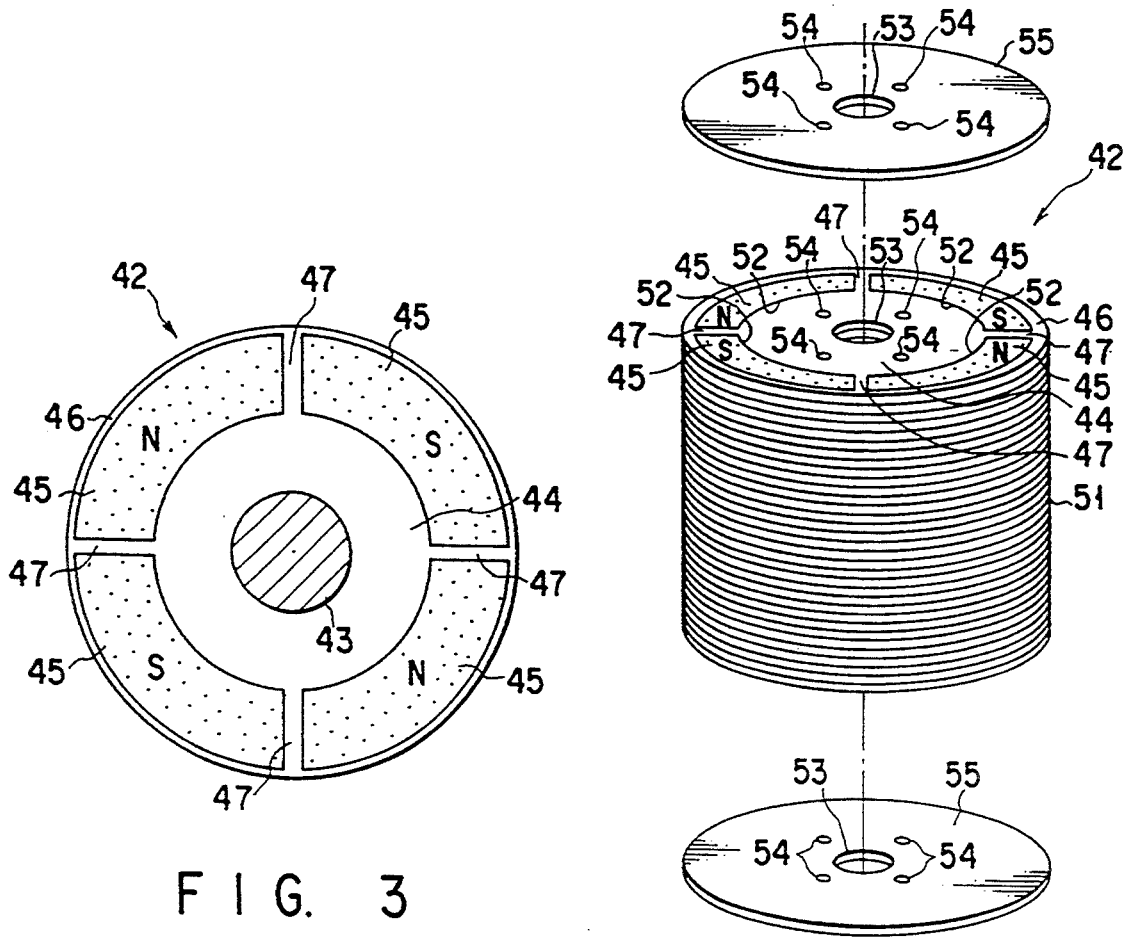
FIG. 3
FIG. 4

DRIVE APPARATUS FOR BRUSHLESS DC MOTOR AND FAILURE DIAGNOSING METHOD FOR THE SAME

BACKGROUND OF THE INVENTION

1. Field of the Invention

The present invention relates to a drive apparatus for a brushless DC motor mounted on, e.g., a compressor, and a failure diagnosing method for diagnosing whether a failure occurs in the brushless DC motor and the drive apparatus.

2. Description of the Related Art

A brushless DC motor is constituted by a stator on which a plurality of phase coils are mounted, and a rotor provided with permanent magnets.

A drive apparatus for this brushless DC motor is constituted by an inverter for rectifying a voltage from an AC power supply, converting the voltage to an AC voltage having an arbitrary frequency, and outputting the obtained AC voltage, a position detection circuit for detecting a rotational position of the rotor of the brushless DC motor, and a controller for turning on/off the respective switching elements of the inverter in accordance with the detection result obtained by the position detection circuit.

The inverter is constituted by a DC voltage circuit for rectifying the AC voltage from the AC power supply and outputting an obtained DC voltage, and a plurality of switching elements to which the output voltage from the DC voltage circuit is applied.

When the switching elements of the inverter are turned on/off, a current sequentially flows to the respective phase coils of the brushless DC motor. When power is supplied to the phase coils, the respective phase coils generate magnetic fields. The rotor is rotated by the interaction of the magnetic fields of the phase coils and the magnetic fields of the permanent magnets of the rotor. Switching of power supply to the respective phase coils is called commutation.

When the rotor is rotated, a voltage is induced in one phase coil to which power is not supplied. The induced voltage is input to the position detection circuit. The position detection circuit compares the input induced voltage with a predetermined reference voltage. When the level of the induced voltage and the level of the reference voltage intersect, the position detection circuit outputs a reference position detection signal. The reference position detection signal is input to the controller.

The controller determines the commutation timing in response to input of the reference position detection signal. Rotor position detection and commutation are repeated in this manner, thereby continuing rotation of the rotor.

The drive apparatus and the brushless DC motor are electrically connected to each other through a connector. This connector comprises a drive apparatus-side terminal and a motor-side terminal. The two terminals of this connector are connected by a manual operation upon shipping from the manufacturer.

If a trouble occurs in the operation of the brushless DC motor, the person in charge of maintenance disconnects the two terminals of the connector to determine whether the cause of the trouble exists in the drive apparatus or in the motor.

When, however, the two terminals of the connector are disconnected, the voltage induced in the phase coil to which power is not supplied cannot be fetched by the position detection circuit. In other words, the position of the rotor cannot be detected. Then, the inverter cannot be started, making it difficult to determine the cause of the trouble.

SUMMARY OF THE INVENTION

It is an object of the present invention to easily and quickly determine, when a trouble occurs in the operation of a brushless DC motor, whether the cause of the trouble exists in the drive apparatus or in the brushless DC motor.

According to the present invention, there is provided a drive apparatus for a brushless DC motor constituted by a stator having a plurality of phase coils and a rotor having magnets, comprising:

power supply means for sequentially supplying power to the phase coils;

control means for executing a service operation for forcibly switching power supply from the power supply means to the phase coils at a predetermined frequency; and selecting means for selecting whether or not the service operation by the control means is to be executed.

According to the present invention, there is also provided a failure diagnosing method for a motor drive/control apparatus which has a brushless DC motor constituted by a stator having a plurality of phase coils and a rotor having magnets, and sequentially supplies power to the phase coils, thereby driving the brushless DC motor, the method comprising:

the first step of setting a service operation mode for diagnosing a failure of the apparatus;

the second step of executing, when the service operation mode is set by the first step, a service operation for forcibly switching power supply to the phase coils at a predetermined frequency; and the third step of diagnosing, when the service operation is executed by the second step, presence/absence of a failure in the apparatus in accordance with whether or not voltage levels of power supply to the phase coils are in an equilibrium state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a sectional plan view showing the arrangement of a brushless DC motor according to this embodiment;

FIG. 3 is a plan view showing the arrangement of a rotor shown in FIG. 2;

FIG. 4 is a perspective view showing the arrangement of the rotor in FIG. 2 in detail;

DETAILED DESCRIPTION OF THE PREFERRED EMBODIMENTS

A preferred embodiment of the present invention will be described with reference to the accompanying drawings.

Figure 1:
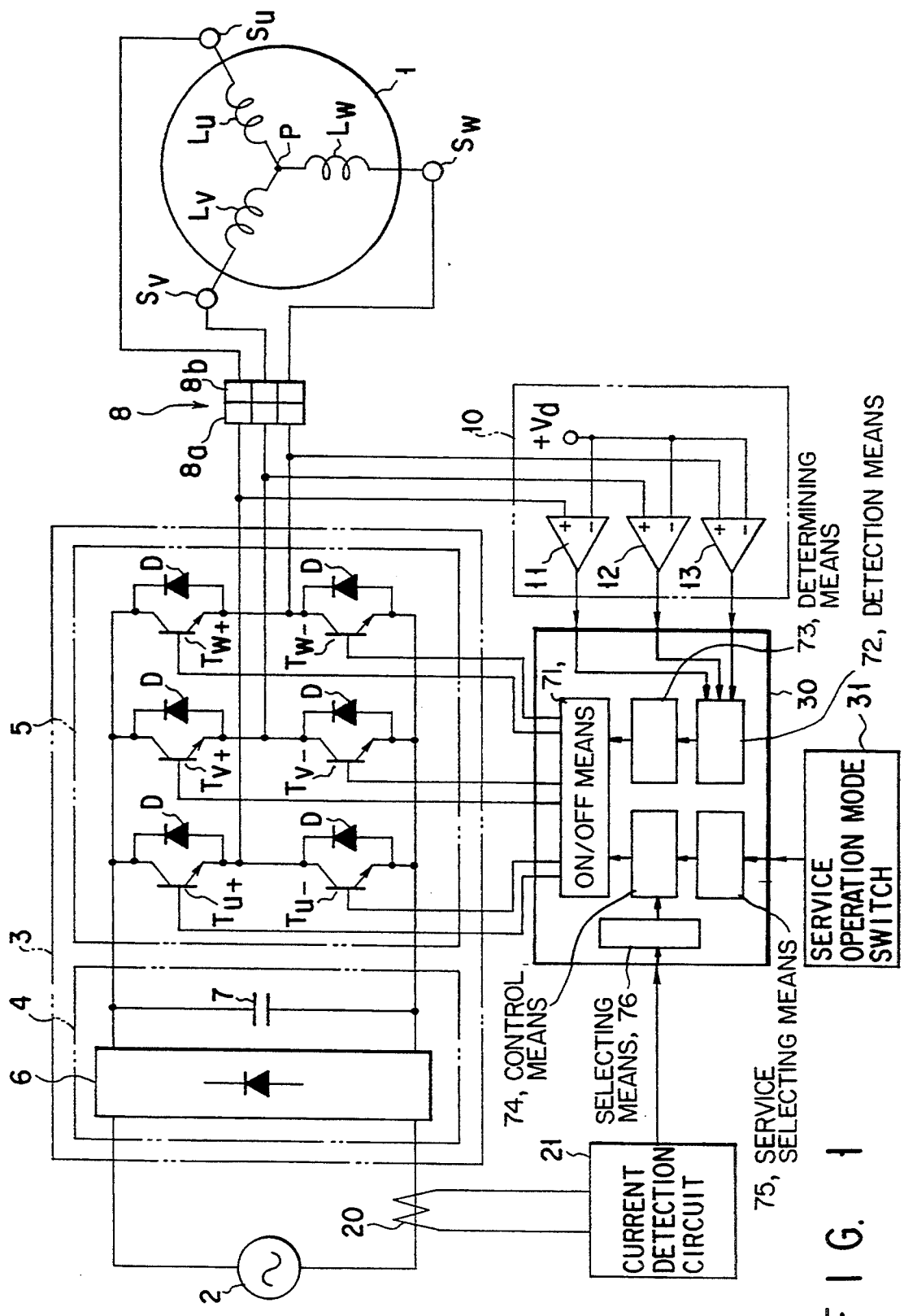
FIG. 1 is a block diagram of an electric circuit according to an embodiment of the present invention.

Referring to FIG. 1, reference numeral 1 denotes a brushless DC motor. The brushless DC motor 1 has three phase coils $L_u$, $L_v$, and $L_w$ that are star-connected to each other through a neutral point P as the center. Terminals $S_u$, $S_v$, and $S_w$ are connected to the non-connected ends of the phase coils $L_u$, $L_v$, and $L_w$, respectively.

An inverter 3 is connected to a single-phase AC power supply 2. The inverter 3 comprises a DC voltage circuit 4 and a switching circuit 5 to which an output voltage from the DC voltage circuit 4 is applied.

The DC voltage circuit 4 has a rectifying circuit 6 comprising a diode bridge, and a smoothing capacitor 7, and outputs a DC voltage obtained by rectifying the voltage of the single-phase AC power supply 2.

The switching circuit 5 is provided with U-, V-, and W-phase three series circuits each consisting of upstream and downstream switching elements. Transistors $T_{u+}$ and $T_{u-}$ are respectively used as the upstream and downstream switching elements of the U-phase series circuit. Transistors $T_{v+}$ and $T_{v-}$ are respectively used as the upstream and downstream switching elements of the V-phase series circuit. Transistors $T_{w+}$ and $T_{w-}$ are respectively used as the upstream and downstream switching elements of the W-phase series circuit. Flywheel diodes D are connected in parallel with the corresponding transistors.

Terminals $8_a$ of a connector 8 are connected to the mutual connection point of the transistors $T_{u+}$ and $T_{u-}$, the mutual connection point of the transistors $T_{u+}$ and $T_{v-}$, and the mutual connection point of the transistors $T_{w+}$ and $T_{w-}$ of the switching circuit 5. Terminals $8_b$ of the connector 8 are connected to the terminals $S_u$, $S_v$, and $S_w$ of the brushless DC motor 1. The terminals $8_a$ and $8_b$ of the connector 8 are connected by a manual operation upon shipping from the manufacturer.

The switching circuit 5 sequentially supplies power to the phase coils $L_u$, $L_v$, and $L_w$ of the brushless DC motor 1 by turning on/off the respective transistors.

A position detection circuit 10 is connected to the terminals $8_a$ of the connector 8. The position detection circuit 10 detects the rotational position of a rotor 42 (to be described later) of the brushless DC motor 1 and has comparators 11, 12, and 13.

A voltage induced in the phase coil $L_u$ of the brushless DC motor 1 is fetched by the non-inverting input terminal (+) of the comparator 11 through the connector 8. A voltage induced in the phase coil $L_v$ of the brushless DC motor 1 is fetched by the non-inverting input terminal (+) of the comparator 12 through the connector 8. A voltage induced in the phase coil $L_w$ of the brushless DC motor 1 is fetched by the non-inverting input terminal (+) of the comparator 13 through the connector 8.

A reference voltage $V_d$ is input to the inverting input terminals (−) of the comparators 11, 12, and 13. The reference voltage $V_d$ is set at a level ½ that of the output voltage of the DC voltage circuit 4.

The comparators 11, 12, and 13 output a logic "0" signal when the voltage fetched by their non-inverting input terminals (+) is lower than the reference voltage $V_d$, and output a logic "1" signal when the input voltage at their non-inverting input terminals (+) is equal to or higher than the reference voltage $V_d$.

Outputs from the comparators 11, 12, and 13 are supplied to a controller 30. The controller 30 generates drive signals to the respective transistors of the switching circuit 5 in accordance with the outputs from the comparators 11, 12, and 13. These drive signals are supplied to the bases of the respective transistors of the switching circuit 5.

A current sensor 20 is mounted on the connection line between the power supply 2 and the inverter 3. The current sensor 20 detects an input current I flowing from the power supply 2 to the inverter 3. An output from the current sensor 20 is input to a current detection circuit 21. The current detection circuit 21 determines whether or not the input current I detected by the current sensor 20 exceeds a preset value $I_s$. The determination result is sent to the controller 30.

The controller 30 is connected to a service operation mode switch 31. The service operation mode switch 31 serves to set the service operation mode which is used for diagnosing a failure of the drive apparatus and the brushless DC motor, and is provided to, e.g., the outdoor unit of an air conditioner.

The controller 30 mainly has the following function means:

[1] an on/off means 71 for turning on/off each transistor of the switching circuit 5. This on/off means 71 and switching circuit 5 jointly constitutes a power supply means that supplies power sequentially to the phase coils Lu, Lv, Lw of the brushless DC motor.

[2] a detection means 72 for detecting the reference rotational position of the rotor 42 (to be described later) of the brushless DC motor 1 from the output of the position detection circuit 10;

[3] a determining means 73 for determining the switching timings to supply power from the power supply means to the phase coils $L_u$, $L_v$, and $L_w$ of the brushless DC motor 1 in accordance with the reference rotational position detected by the detection means;

[4] a control means 74 of the service operation for forcibly switching power supply from the power supply means to the phase coils $L_u$, $L_v$, and $L_w$ of the brushless DC motor 1 for a predetermined period of time at a specific frequency;

[5] a selecting means 75 for selecting whether or not the service operation by the control means is to be executed in response to the operation of the service operation mode switch 31; and

[6] a service selecting means 76 for selecting whether or not the service operation by the control means is to be executed in accordance with the determination result of the current detection circuit 21.

The detailed arrangement of the brushless DC motor 1 will be described.

As shown in FIG. 2, the brushless DC motor 1 has a stator 41 and the rotor 42 which is rotatably provided within the stator 41.

A large number of (24) slots $41_a$ are formed in the inner circumferential surface of the stator 41, and these slots $41_a$ have slot numbers "1" to "24". The phase coils $L_u$, $L_v$, and $L_w$ are buried in these slots $41a$ at angular intervals of 120° from each other.

An actual phase coil $L_u$ is obtained by connecting a pair of phase coils $L_{ua}$ and $L_{ub}$ in parallel with each other. The phase coils $L_{ua}$ and $L_{ub}$ are arranged at positions opposite to each other.

An actual phase coil $L_v$ is obtained by connecting a pair of phase coils $L_{va}$ and $L_{vb}$ in parallel with each other. The phase coils $L_{va}$ and $L_{vb}$ are arranged at positions opposite to each other.

An actual phase coil $L_w$ is obtained by connecting a pair of phase coils $L_{wa}$ and $L_{wb}$ in parallel with each other. The phase coils $L_{wa}$ and $L_{wb}$ are arranged at positions opposite to each other.

As shown in FIG. 3, the rotor 42 has a yoke 44 provided around a rotating shaft 43, a plurality of, e.g., four permanent magnets 45 provided around the yoke 44, an annular portion 46 provided around the permanent magnets 45, and four connecting portions 47 existing in the gaps among the permanent magnets 45 and connecting the yoke 44 and the annular portion 46. The connecting portions 47 magnetically connect the yoke 44 and the annular portion 46.

As shown in FIG. 4 in detail, the yoke 44, the annular portion 46, and the respective connecting portions 47 of the rotor 42 are constituted by stacking a large number of disc-shaped steel plates 51. Each steel plate 51 has four insertion holes 52 in its peripheral portion for receiving the respective permanent magnets 45 therein, an insertion hole 53 in its central portion for receiving the rotating shaft 43 therein, and four rivet insertion holes 54 around the insertion hole 53 (a portion serving as the yoke 44). End plates 55 are provided at two ends of the stacking body of the steel plates 51 in the stacking direction. Each end plate 55 also has an insertion hole 53 for inserting the rotating shaft 43 therein and four rivet insertion holes 54.

To assemble this rotor 42, the steel plates 51 are stacked, and the permanent magnets 45 are inserted in the respective insertion holes 52. The permanent magnets 45 are formed by solidifying a magnetic powder. The permanent magnets 45 do not have magnetic poles yet when they are inserted in the corresponding insertion holes 52, and the magnetic poles are formed only after magnetization is performed. Thereafter, the end plates 55 are abutted against the two ends of the stacking body of the steel plates 51, and rivets (not shown) are inserted in the rivet insertion holes 54 of the end plates 55 and the steel plates 51. The two ends of the rivets are caulked, thereby fixing the entire body of the rotor 42.

Figure 5:
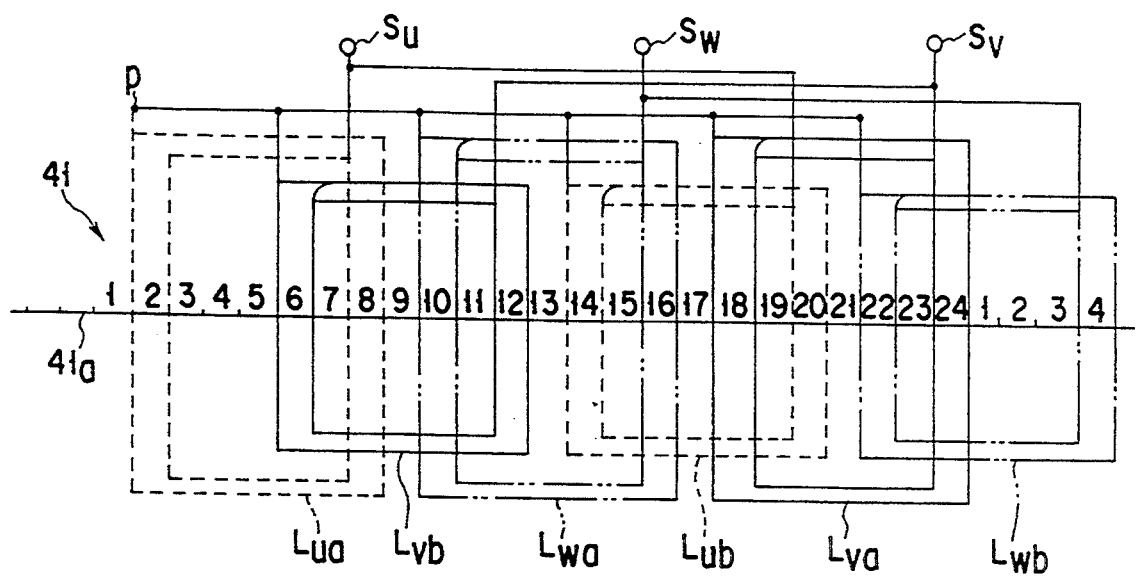
FIG. 5 is a developed view showing a state wherein the respective phase coils are mounted on a stator shown in FIG. 2.

FIG. 5 shows the relationship between the respective slots $41_a$ of the stator 41 and the phase coils $L_{ua}$, $L_{ub}$, $L_{va}$, $L_{vb}$, $L_{wa}$, and $L_{wb}$.

Figure 6:
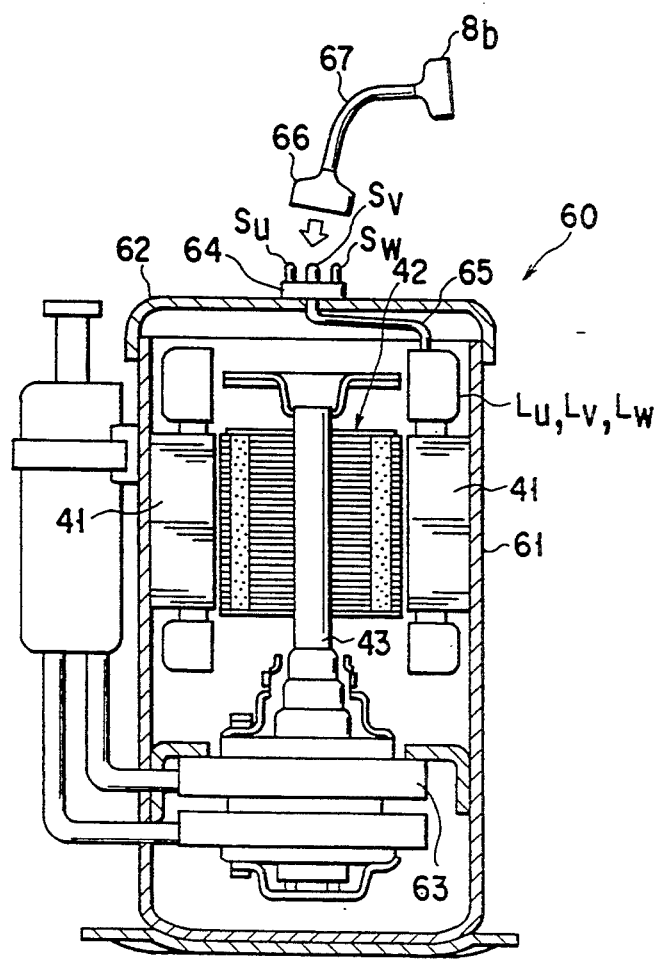
FIG. 6 is a sectional view showing the arrangement of a compressor in which the brushless DC motor according to this embodiment is incorporated.

For example, the brushless DC motor 1 having the above arrangement is mounted on a compressor 60 of an air conditioner, as shown in FIG. 6.

The outer appearance of the compressor 60 is formed by a casing 61 and a cover 62 closing the upper opening of the casing 61. A compressor unit 63 is provided at the bottom portion in the casing 61, and the brushless DC motor 1 is incorporated above the compressor unit 63.

A terminal plate 64 is provided on the upper surface of the cover 62, and the terminals $S_u$, $S_v$, and $S_w$ are provided to the terminal plate 64. The terminals $S_u$, $S_v$, and $S_w$, and the phase coils $L_u$, $L_v$, and $L_w$ in the casing 61 are connected to each other through an electric cable 65.

When the manufacture of the compressor 60 is completed, a connector 66 is mounted on the terminals $S_u$, $S_v$, and $S_w$ of the terminal plate 64. The connector 66 is connected to the terminals 8b of the connector 8 through an electric cable 67.

The operation of the above arrangement will be described with reference to FIGS. 7 and 8. Shown in FIG. 7 are phase voltage and phase current signals $V_u$ and $I_u$, $V_v$ and $I_v$, and $V_w$ and $I_w$ corresponding to the two phase power supplied to and/or induced in coils $L_u$, $L_v$ and $L_w$, respectively.

Figure 7:
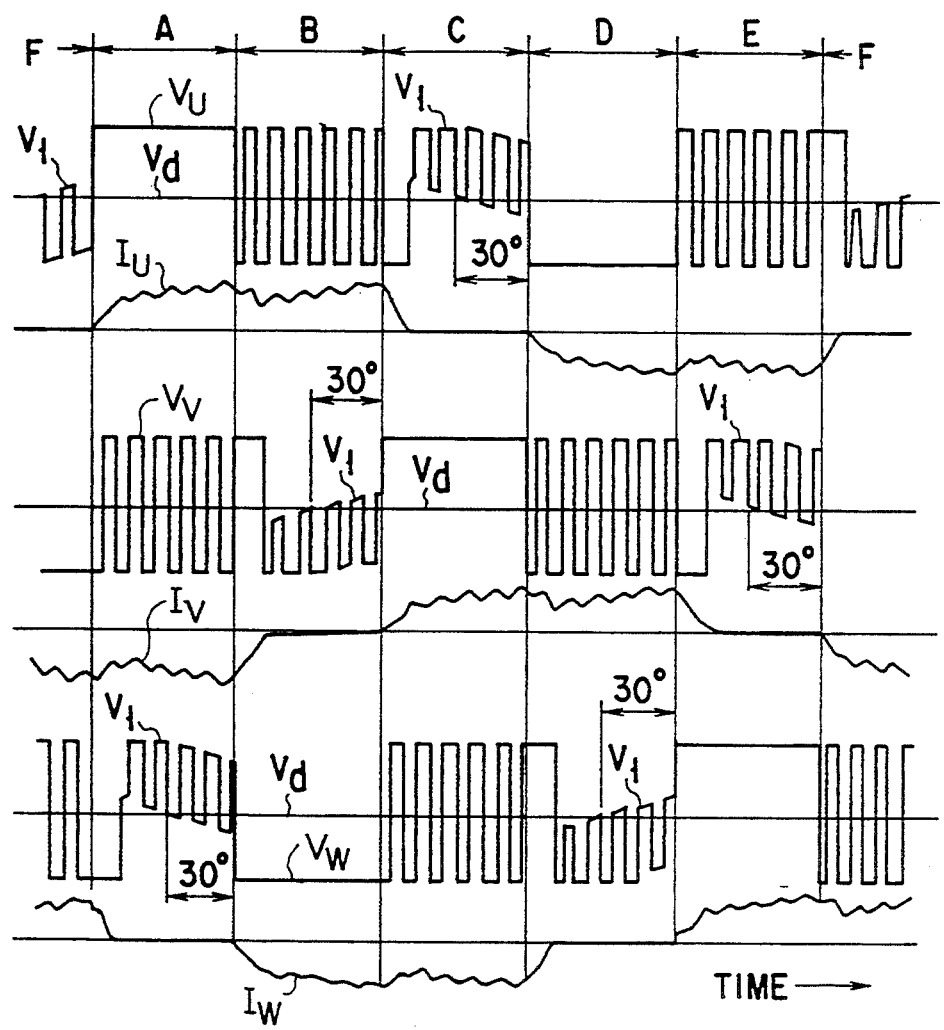
FIG. 7 is a signal waveform chart for explaining the operation of this embodiment.
Figure 8:
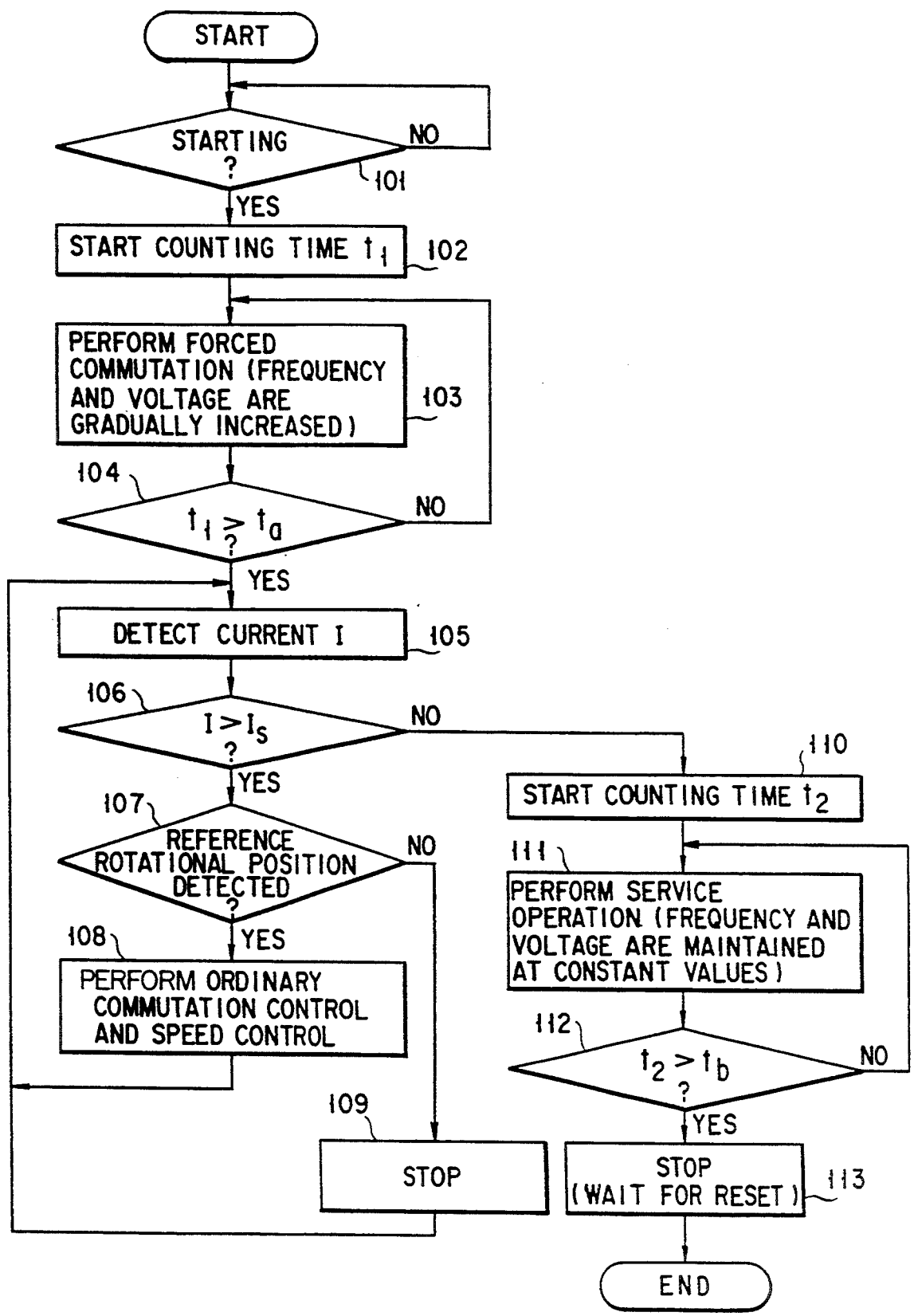
FIG. 8 is a flow chart for explaining the operation of this embodiment.

First, as shown in FIG. 7, two-phase power supply from the phase coil $L_u$ to the phase coil $L_v$ is performed (period A). More specifically, the upstream and downstream transistors $T_{u+}$ and $T_{v-}$ are turned on. Of these transistors, the transistor $T_{u+}$ is continuously kept on, and the transistor $T_{v-}$ is intermittently turned on.

When magnetic fields are generated by the phase coils $L_u$ and $L_v$, a rotational torque is caused in the rotor 42 by the interaction of these magnetic fields and the magnetic fields generated by the respective permanent magnets 45, so that the rotor 42 starts rotation. At this time, a voltage $V_1$ is induced in one phase coil $L_w$, to which power is not supplied, by the magnetic function accompanying rotation of the respective permanent magnets 45.

The induced voltage $V_1$ in the phase coil $L_w$ is compared by the comparator 13 of the position detection circuit 10 with the reference voltage $V_d$, and a comparison output is supplied to the controller 30. The controller 30 detects a change point (a point where the induced voltage $V_1$ and the reference voltage $V_d$ intersect) of the logic level of the comparison output as the reference rotational position of the rotor 42.

When the reference rotational position is detected, after a time corresponding to an electrical angle of 30° elapses, power supply is switched from two-phase power supply to the phase coils $L_u$ and $L_v$ (period A) to two-phase power supply to the phase coils $L_u$ and $L_w$ (period B). In other words, commutation occurs.

More specifically, in two-phase power supply to the phase coils $L_u$ and $L_w$ (period B), the upstream and downstream transistors $T_{u+}$ and $T_{w-}$ are turned on. Of these transistors, the transistor $T_{u+}$ is intermittently turned on, and the downstream transistor $T_{w-}$ is continuously kept on.

When magnetic fields are generated by the phase coils $L_u$ and $L_w$, a rotational torque is caused in the rotor 42 by the mutual function of these magnetic fields and the magnetic fields generated by the respective permanent magnets 45, so that the rotor 42 continues rotation. At this time, a voltage $V_1$ is induced in one phase coil $L_v$, to which power is not supplied, by the magnetic function accompanying rotation of the respective permanent magnets 45.

The induced voltage $V_1$ in the phase coil $L_v$ is compared by the comparator 12 of the position detection circuit 10 with the reference voltage $V_d$, and a comparison output is supplied to the controller 30. The controller 30 detects a change point (a point where the induced voltage $V_1$ and the reference voltage $V_d$ intersect) of the logic level of the comparison output as the reference rotational position of the rotor 42.

When the reference rotational position is detected, after a time corresponding to an electrical angle of 30° elapses, power supply is switched from two-phase power supply to the phase coils $L_u$ and $L_w$ (period B) to two-phase power supply to the phase coils $L_v$ and $L_w$ (period C). In other words, commutation occurs.

More specifically, in two-phase power supply to the phase coils $L_v$ and $L_w$ (period C), the upstream and downstream transistors $T_{v+}$ and $T_{w-}$ are turned on. Of these transistors, the transistor $T_{v+}$ is continuously kept on, and the transistor $T_{w-}$ is intermittently turned on.

In this manner, switching (commutation) of two-phase power supply is repeated with a delay of an electric angle of 30° from detection of the reference rotational position, and rotation of the rotor 42 is continued.

It must be noted that at starting (YES in step 101), the reference rotational position of the rotor 42 is neglected for a predetermined period of time $t_a$ (e.g., 30 to 60 seconds) based on a time count $t_1$, and forced commutation is performed (steps 102, 103, and 104).

In forced commutation, two-phase power supply is switched at a frequency which is gradually increased from a low frequency. Simultaneously, the on/off duty of the transistor which is intermittently turned on during two-phase power supply is gradually increased, and the voltage applied to the respective phase coils is gradually increased. Hence, the brushless DC motor 1 is reliably started.

When the predetermined period of time $t_a$ based on the time count $t_1$ elapses (YES in step 104), the input current I to the inverter 3 is detected by the current sensor 20 (step 105), and the detection current I is compared by the current detection circuit 21 with the preset value $I_s$ (step 106).

If the detection current I of the current sensor 20 exceeds the preset value $I_s$ (YES in step 106) and the reference rotational position of the rotor 42 is detected (YES in step 107), it is determined that the brushless DC motor 1 operates normally, and normal commutation control based on the reference rotational position of the rotor 42 is performed according to this determination (step 108).

Simultaneously, normal speed control for setting the speed of the brushless DC motor 1 to a target value is performed (step 108). More specifically, in normal speed control, the on/off duty of the transistor which is intermittently turned on during two-phase power supply is controlled, and thus the speed of the brushless DC motor 1 is set at the target value. The target value is set by a command from the air conditioner.

Assume that during operation of the brushless DC motor 1, the terminals $8_a$ and $8_b$ of the connector 8 are disconnected due to vibration or the like. In this case, the induced voltage $V_1$ cannot be fetched by the position detection circuit 10 from the brushless DC motor 1, and the reference rotational position of the rotor 42 cannot be detected.

If the reference rotational position of the rotor 42 cannot be detected, a drive signal is not supplied from the controller 30 to the switching circuit 5, thereby stopping operation of the switching circuit 5 (step 109). At this time, the input current I to the inverter 3 is decreased to the preset value Is or less.

If the input current I to the inverter 3 is decreased to the preset value $I_s$ or less (NO in step 106), the service operation mode is set for a predetermined period of time $t_b$ (e.g., 3 to 5 minutes) based on a time count $t_2$ regardless of whether or not the reference rotational position is detected, and the service operation is executed (steps 110, 111, and 112).

In this service operation, drive signals are supplied from the controller 30 to the switching circuit 5 so that two-phase power supply to the brushless DC motor 1 is forcibly switched at a predetermined frequency and that the on/off duty of the transistor which is intermittently turned on during two-phase power supply is maintained at a constant value. Namely, even if the terminals $8_a$ and $8_b$ of the connector 8 are disconnected, the switching circuit 5 is driven again regardless of this, and a voltage is output from the switching circuit 5.

During execution of the service operation, the person in charge of maintenance checks if the levels of the output voltages of the three phases of the switching circuit 5 are in the equilibrium state by applying a tester to the terminals $8_a$ of the connector 8, thereby discriminating the presence/absence of a failure of the drive apparatus (i.e., the inverter 3).

In other words, if the levels of the output voltages of the three phases of the switching circuit 5 are in the equilibrium state, it is diagnosed that the drive apparatus does not have a failure.

When the service operation is ended (steps 112 and 113), the person in charge of maintenance resets the controller 30, thereby resuming the normal operation.

If any trouble occurs in the operation of the brushless DC motor 1, the person in charge of maintenance only need to diagnose which one of the drive apparatus and the brushless DC motor 1 has a failure. In this case, it suffices if the terminals $8_a$ and $8_b$ of the connector 8 are disconnected.

When the terminals $8_a$ and $8_b$ of the connector 8 are disconnected, the reference rotational position of the rotor 42 cannot be detected and operation of the switching circuit 5 is temporarily stopped, as described above, and subsequently the input current I is decreased to the predetermined value $I_s$ or less, so that the service operation is executed.

Therefore, the person in charge of maintenance can diagnose whether the cause of the failure exists in the drive apparatus (i.g., the inverter 3) or in the brushless DC motor 1 by checking whether or not the levels of the output voltages of the three phases of the switching circuit 5 are in the equilibrium state by applying the tester to the terminals $8_a$ of the connector 8.

More specifically, if the levels of the output voltages of the three phases of the switching circuit 5 are in the equilibrium state, it is apparent that the cause of the trouble exists not in the drive apparatus but in the brushless DC motor 1 (for example, the magnetic force of the rotor 42 is decreased). If the levels of the output voltages of the three phases of the switching circuit 5 are not in the equilibrium state, it is apparent that the cause of the trouble exists in the drive apparatus (for example, a transistor of the switching circuit 5 is damaged).

The service operation can be appropriately executed also by operating the service operation mode switch 31 provided to the indoor unit of the air conditioner. Accordingly, if diagnosis takes a long period of time, the service operation may be repeatedly performed by operating the service operation mode switch 31.

Forced commutation may occur at starting and a trouble diagnosis is performed during this commutation. Since forced commutation at starting lasts as short as 30 to 60 seconds, it is impossible for the person in charge of maintenance to complete the start of operation at the indoor unit side, shift to the outdoor unit side where the connector 8 is located, and complete diagnosis during this short period of time. Furthermore, in forced commutation at starting, the frequency of commutation and the output voltage of the switching circuit 5 are not constant but are gradually increased.

Considering these facts, if the service operation can be executed only by disconnecting the terminals $8_a$ and $8_b$ of the connector 8 or by operating the service operation mode switch 31, and if the frequency of commutation and the output voltage of the switching circuit 5 become constant during the service operation, it is very effective because the diagnosing operation can be performed easily and quickly.

The predetermined period of time $t_b$ (e.g., 3 to 5 minutes) is determined as the duration of the execution of the service operation. This duration is sufficient for performing failure diagnosis.

For example, if the terminals $8_a$ and $8_b$ of the connector 8 are disconnected upon shipping from the manufacturer and the power is turned on in this state, the service operation is started. Since this service operation is automatically stopped after a lapse of the predetermined period of time $t_b$, the inconvenience of endless service operation can be avoided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A drive apparatus for a brushless DC motor constituted by a stator having a plurality of phase coils and a rotor having magnets, said drive apparatus comprising:
   a connector for electrically connecting said brushless DC motor and said drive apparatus;
   power supply means for sequentially supplying power to said phase coils through said connector;
   detection means for receiving a voltage induced in one of said phase coils to which power is not supplied and for detecting a rotational position of said rotor based on said voltage, said voltage being received through said connector;
   determining means for determining a switching timing of power supplied from said power supply means to said phase coils based on said rotational position of said rotor detected by said detection means;
   selecting means for selecting a service operation mode; and
   control means for setting a specific frequency for switching said power supplied from said power supply means to said phase coils, said power being supplied based on said specific frequency when said service operation mode is selected by said selecting means irrespective of whether said rotational position is detected by said detection means.

2. An apparatus according to claim 1, wherein said selecting means selects said service operation mode in response to a manual operation.

3. An apparatus according to claim 1, further comprising:
   current detection means for detecting an input current to said drive apparatus.

4. An apparatus according to claim 3, wherein said selecting means selects said service operation mode when said input current detected by said current detection means is smaller than a preset value.

5. An apparatus according to claim 1, wherein said power supplied from said power supply means to said phase coils is switched based on said specific frequency set by said control means for a predetermined period of time.

6. A failure diagnosing method for use in a motor drive/control apparatus which comprises:
   a brushless DC motor having a stator with phase coils and a rotor with magnets;
   a switching circuit for sequentially supplying power to said phase coils;
   a connector having first terminals being connected to an output end of said switching circuit and second terminals being connected to said phase coils, for connecting said first terminals to said second terminals to establish an electrode connection between said switching circuit and said phase coils; and
   a position detection circuit for receiving a voltage induced in one of said phase coils to which power is not supplied and for detecting a rotational position of said rotor from said received voltage, said voltage being received through said connector; and
   said motor drive/control apparatus controlling a switching timing of power supply from said switching circuit to said phase coils based on said rotational position detected by said position detection circuit,
   said failure diagnosing method comprising the steps of:
   selecting a service operation mode;
   setting a specific frequency for switching power which is supplied to said phase coils by said switching circuit when said service operation mode is selected in said first step;
   checking, when said service operation mode is selected in said first step, whether or not a level of each voltage generated at said first terminals is in an equilibrium state; and
   determining the existence of a failure in said apparatus when said level of each voltage generated at said first terminals is not in an equilibrium state.

7. The method according to claim 6, wherein said service operation mode is selected in response to a manual operation.

8. The method according to claim 6, wherein said service operation mode is selected by detecting a current input to said apparatus, comparing said detected current to a preset value, and selecting said service operation mode when said detected current is smaller than said preset value.

9. The method according to claim 6, wherein said power supplied to said phase coils by said switching circuit is switched for a predetermined period of time without reference to said detection of said rotational position.

* * * * *